(12) United States Patent
Wu et al.

(10) Patent No.: US 8,638,248 B2
(45) Date of Patent: Jan. 28, 2014

(54) INPUT-INDEPENDENT SELF-CALIBRATION METHOD AND APPARATUS FOR SUCCESSIVE APPROXIMATION ANALOG-TO-DIGITAL CONVERTER WITH CHARGE-REDISTRIBUTION DIGITAL TO ANALOG CONVERTER

(75) Inventors: Qiong Wu, San Jose, CA (US); Kevin Mahooti, Sunnyvale, CA (US)

(73) Assignee: NXP, B.V., Eindhoven (NL)

( * ) Notice: Subject to any disclaimer, the term of this patent is extended or adjusted under 35 U.S.C. 154(b) by 96 days.

(21) Appl. No.: 13/269,495

(22) Filed: Oct. 7, 2011

(65) Prior Publication Data

US 2013/0088375 A1   Apr. 11, 2013

(51) Int. Cl.
*H03M 1/06* (2006.01)

(52) U.S. Cl.
USPC .......................................... 341/118; 341/155

(58) Field of Classification Search
USPC .......... 341/144, 155, 172, 120, 118, 163, 156
See application file for complete search history.

(56) References Cited

U.S. PATENT DOCUMENTS

| | | | |
|---|---|---|---|
| 4,399,426 A | 8/1983 | Tan | |
| 4,709,255 A | 11/1987 | Hartgring et al. | |
| 5,684,487 A | 11/1997 | Timko | |
| 5,825,316 A | 10/1998 | Kuttner | |
| 6,400,302 B1 * | 6/2002 | Amazeen et al. | 341/172 |
| 6,538,594 B1 * | 3/2003 | Somayajula | 341/172 |
| 6,707,403 B1 * | 3/2004 | Hurrell | 341/120 |
| 2013/0044014 A1 * | 2/2013 | Lin | 341/110 |

OTHER PUBLICATIONS

Lee, H.-S. et al. "A Self-Calibrating 15 bit CMOS A/D Converter", IEEE Journal of Solid-State Circuits, vol. SC-19, No. 6, pp. 813-819 (Dec. 6, 1984).

* cited by examiner

*Primary Examiner* — Peguy Jean Pierre

(57) ABSTRACT

A method and apparatus for correcting the offset and linearity error of a data acquisition system. A charge redistribution digital to analog convertor (CDAC) is connected to one of the differential inputs of a comparator whose second input comes from a function CDAC. The calibration algorithm is built into a digital control unit. The digital control unit detects the offset and capacitor mismatch errors sequentially, stores the calibration codes for each error in calibration mode and provides the input-dependent error correction signals synchronized with the binary search timing to adjust the differential input of the comparator and compensate the input-dependent errors present at the output of the non-ideal function CDAC during normal conversions.

12 Claims, 12 Drawing Sheets

$A_C$   $V_{off} = 0$                               00...0000...0
FIG. 8A
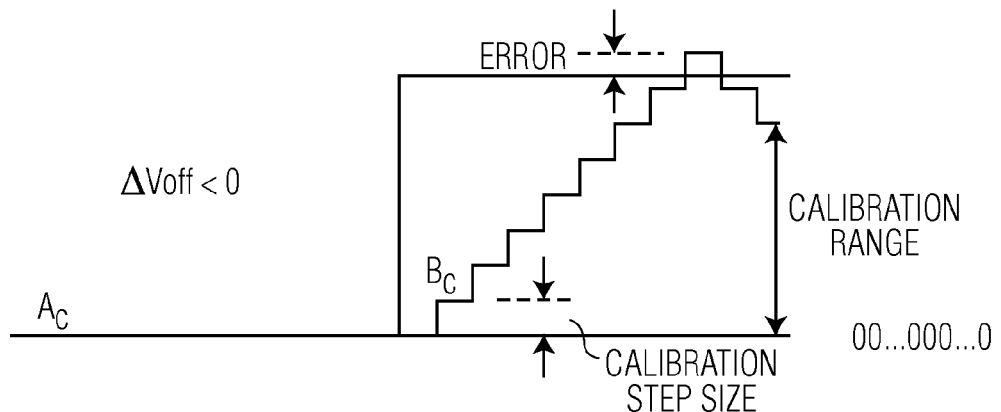
FIG. 8B
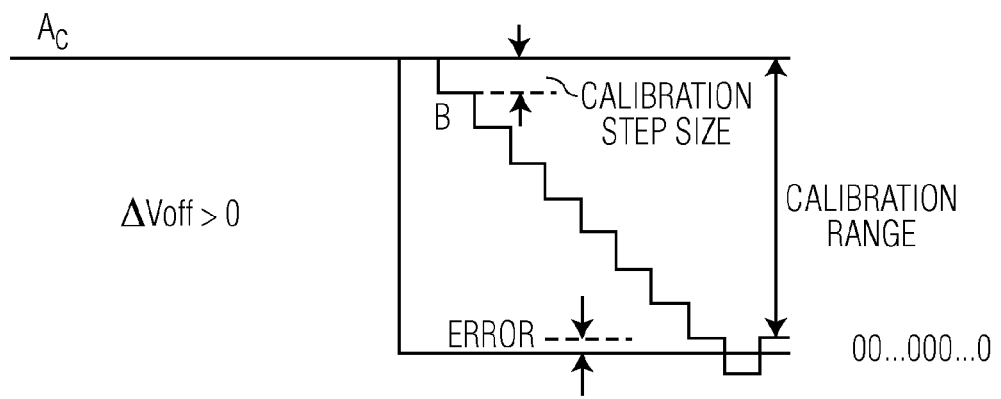
FIG. 8C

INPUT-INDEPENDENT SELF-CALIBRATION METHOD AND APPARATUS FOR SUCCESSIVE APPROXIMATION ANALOG-TO-DIGITAL CONVERTER WITH CHARGE-REDISTRIBUTION DIGITAL TO ANALOG CONVERTER

An analog-to-digital converter (ADC) is a device in a data acquisition system that converts a continuous analog signal to a discrete digital representation for storage, transfer and further digital signal processing (DSP). A successive approximation (SAR) ADC is widely employed in sensor networks, implantable biometrics, measurement applications, acquisition boards, digital scopes and microcontrollers, because a SAR ADC offers low power, medium speed, moderate-to-high resolution, minimal active analog circuit, small die size, low latency and high reusability.

FIG. 1 shows the typical structure of SAR ADC 100 having comparator 110, digital-to-analog converter (DAC) 120 and digital logic 130 with a binary search algorithm built in. Either capacitor arrays or resistor arrays (not shown) typically may be employed to implement DAC 120. In standard CMOS technology, the adoption of capacitor arrays is more typical because for a given area capacitors feature less mismatch errors, faster settling time and less current consumption than resistors, allowing for higher resolutions, higher speed and lower power.

Experiments show that modern CMOS processes typically provide up to 10-bit resolution which is equivalent to 0.1% capacitance ratio mismatch. To achieve resolution higher than 10-bits, additional methods, such as laser trimming, analog calibration and digital self-calibration are typically used to increase the yield.

Production based laser trimming is done at wafer level by trimming the capacitor value in the capacitor array and is typically costly in terms of the manufacturing process and in terms of die size. The improvement from the trimming procedure is typically limited and environmentally dependent due to the mechanical stress during packaging and the long term drift of the laser trimmed components.

Different from the wafer level trimming, analog calibration is implemented after package assembly, therefore typically no package degradation occurs. During the calibration process, an external analog signal source with linearity higher than the resolution of ADC 100 under calibration is provided to the input of ADC 100 and the digital representation of the analog signal is read out and compared with the ideal code. If the real digital output differs from the ideal value, the capacitors in the capacitor DAC 120 are trimmed to meet the requirement; then another analog input is provided. This procedure is typically repeated until all of the capacitors contributing to the most significant bits (MSB) beyond the process matching range are appropriately trimmed. Similarly to laser trimming, the analog calibration process is only performed once at the manufacturer, and, therefore, the ADC accuracy may also degrade with temperature variation and aging. The requirement for an external analog signal source with higher linearity and the time consumed for the error detection and correction procedure typically increases the production testing cost.

In order to avoid the issues related to both the laser trimming and the analog calibration, several self-calibration techniques for the charge-redistribution DAC may be employed.

One such self-calibration technique was published in 1983 as a U.S. Pat. No. 4,399,426 shown in FIG. 2, in which calibration capacitor array 215, memory 220 and additional calibration logic 240, 245 to carry out a calibration algorithm are integrated into the SAR ADC 200 with a binary-weighted charge redistribution DAC. Calibration capacitor array 215 joins function capacitor array 210 at a analog summation node, which is negative input port 231 of comparator 230. The positive input of comparator 230 usually connects to dummy capacitor array 140 (as shown in FIG. 1) to provide symmetric matching to minimize the common mode error originated from the pre-set switches channel charge injection effect and clock feed through effect. The digital representations of the mismatch in function capacitor array 210 are created during the error detection procedure. The digital representations are stored in memory 220 addressed by the digital codes in the SAR and fed to calibration logic 240 to generate mismatch compensation voltages at the output of calibration capacitor array 215. The introduction of calibration capacitor array 215 typically improves the linearity of the DAC, while it increases the die size, reduces the signal gain and increases the signal settling time at the negative input of comparator 230. The synchronization operation between function capacitor array 210 and calibration capacitor array 215 forces the polarity of the error correction signal to be the same as the function signal provided by function capacitor array 210 and limits the mismatch errors being covered. Only if the real capacitor value is smaller than the ideal one, can the mismatch be corrected. Therefore, the validation of the self-calibration technique present in patent '426 typically relies on the process gradient and the layout floor plan.

To improve performance and reduce the die size, ADC 300 is disclosed in U.S. Pat. No. 5,684,487, which is shown in FIG. 3. SAR 350 and control and calibration logic 355 implement the binary search and calibration algorithm. In contrast to patent '426, calibration capacitor array 310 in patent '487 is arranged similarly to function capacitor array 315 (function capacitor array 210 in patent '426) and replaces dummy capacitor 140 (see FIG. 1) at the positive input of comparator 330. Since function capacitor array 315 is isolated from calibration array 310, there is no signal attenuation and no additional settling delay introduced at the negative input of comparator 330. The calibration coefficients are computed off-chip by digital circuitry at the time of manufacture and stored in on-chip read-only-memory (ROM) 340. The introduction of calibration capacitor array 310 at the positive input of comparator 330 provides both error correction voltage and symmetric capacitive load at the negative input without consuming more die area. However, the error voltage shown at the output of function capacitor array 315 cannot be fully compensated. Because only the reference voltage and ground are supplied to calibration capacitor array 310, the error correction signal is input independent. However, the error signal generated from the capacitor cells with mismatch in function capacitor array 315 is input dependent. Subtracting an input independent signal from an input dependent signal leaves an input dependent error at the differential input of comparator 330, as well as at the digital code at the output of comparator 330. This input dependent linearity error degrades the signal-to-noise and distortion ratio (SNDR) and the effective number of bit (ENOB) of ADC 300. Additionally, the one-time manufacture site calibration typically limits the effect of the nonlinearity error correction when environment temperature changes and the mismatch drifting with age.

SUMMARY

In accordance with the invention, a SAR ADC with a binary-weighted charge redistribution DAC using a self-calibration algorithm is disclosed. The SAR ADC includes a comparator, a function capacitor array to perform normal conversion, a calibration capacitor array to provide an error correction signal, digital control logic to control the binary search procedure and calibration logic to search for the error correction coefficients.

BRIEF DESCRIPTION OF THE DRAWINGS

FIG. 8 is a waveform diagram showing the error detection procedure for positive and negative offset errors in accordance with the invention.

DETAILED DESCRIPTION

In an embodiment in accordance with the invention, the calibration process is divided into two steps: error detection and error correction.

Figure 1:
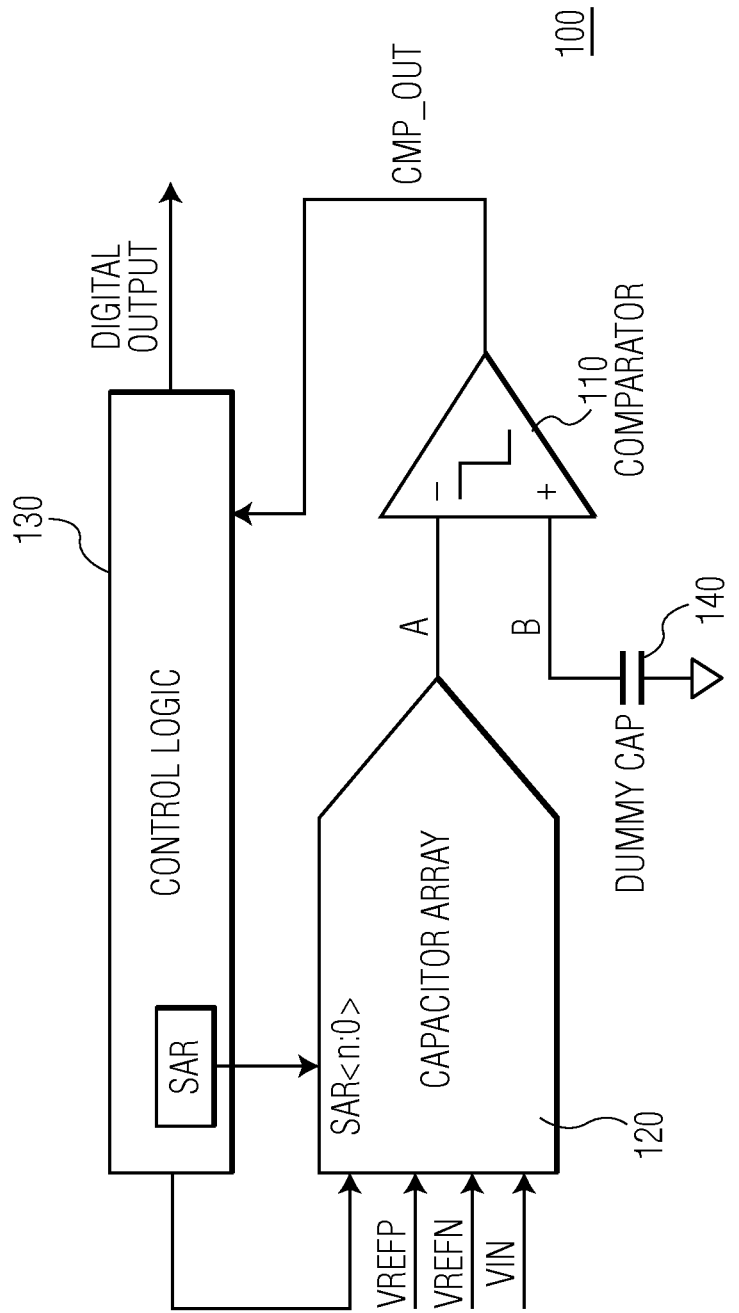
FIG. 1 is a block diagram showing a typical prior art SAR ADC with charge re-distribution DAC.
Figure 2:
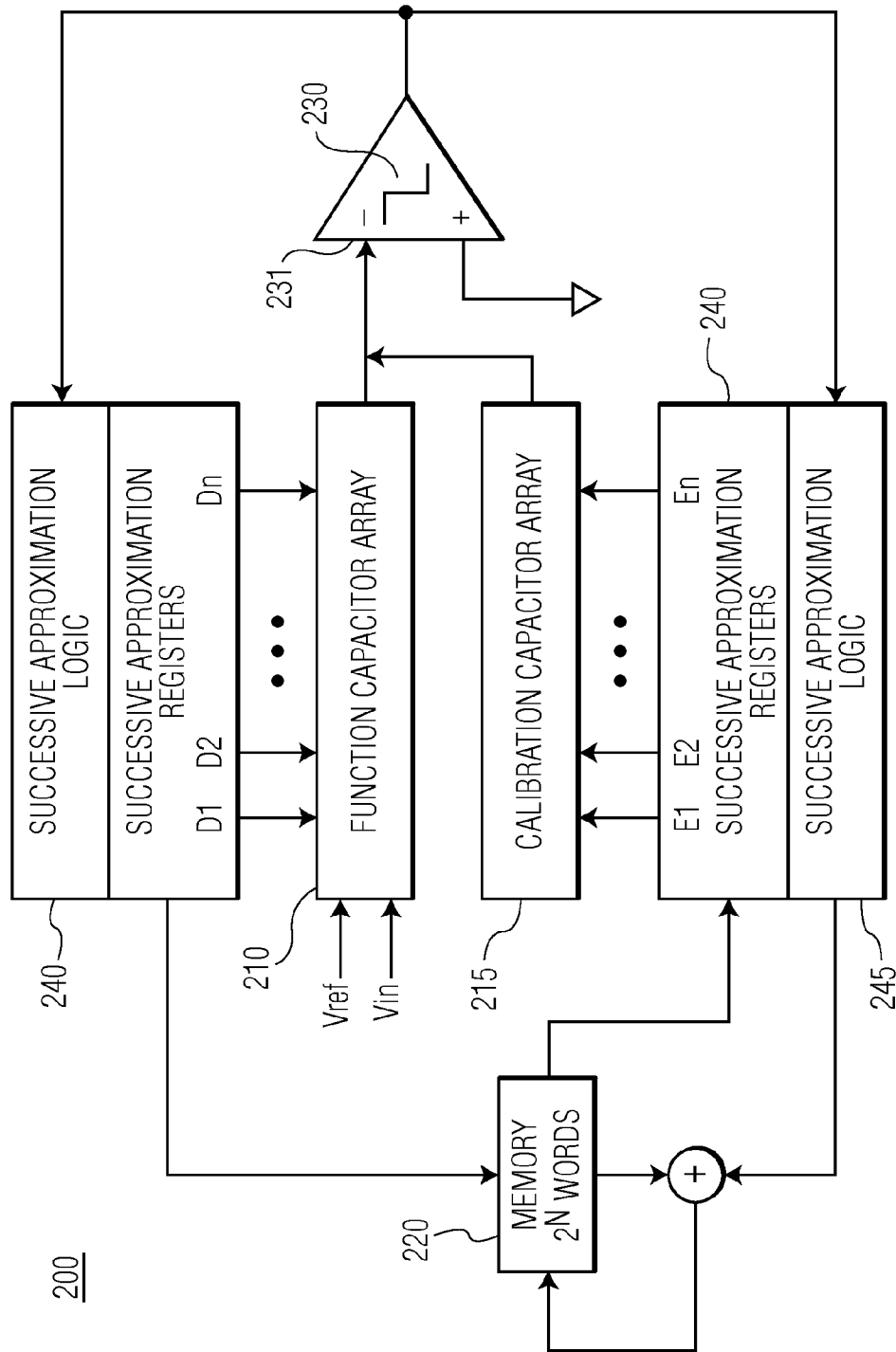
FIG. 2 is a prior art showing the structure diagram of a self-calibration method with two capacitor arrays connected at an analog summing point.
Figure 3:
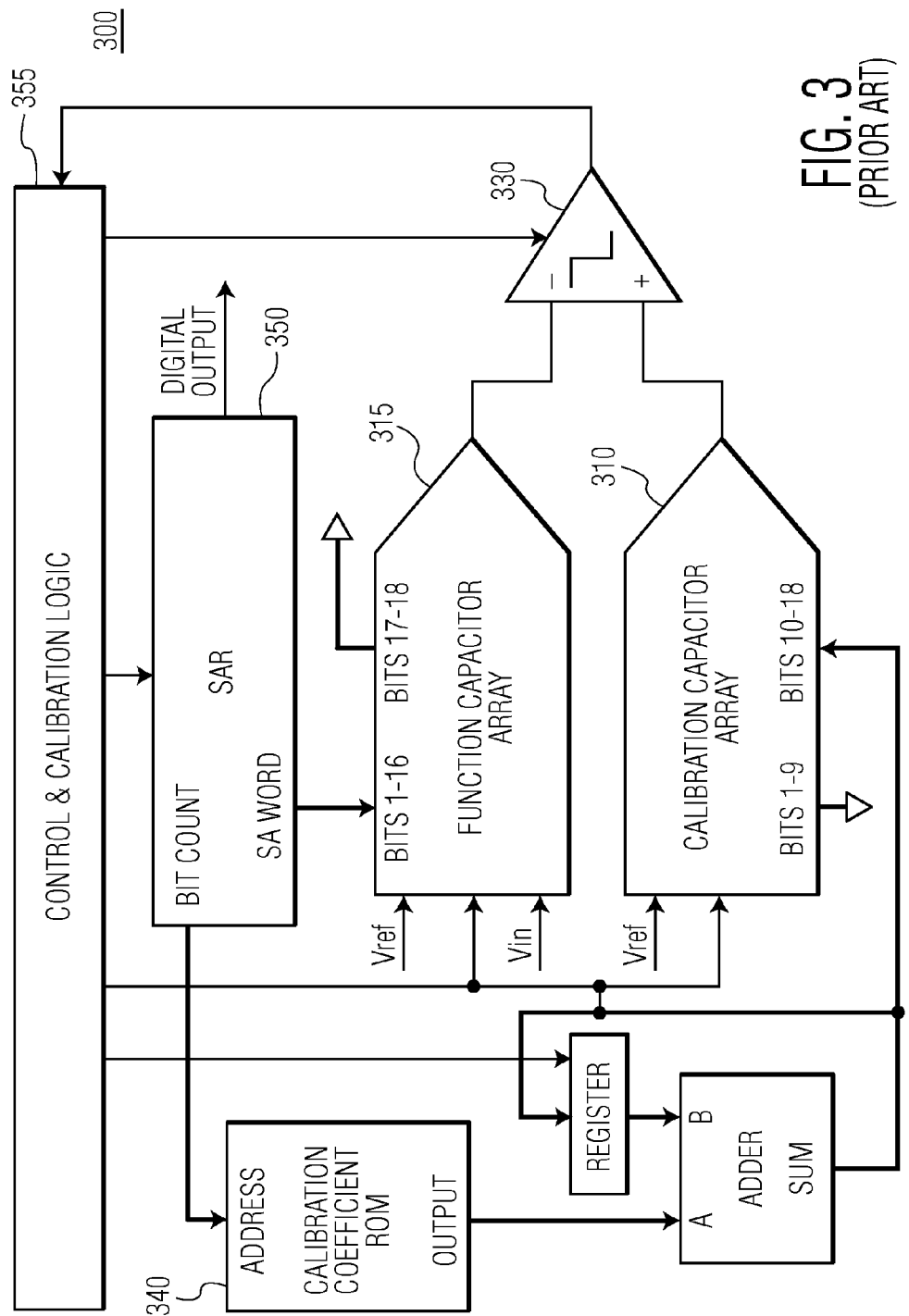
FIG. 3 is a prior art showing the structure diagram of a self-calibration method with two capacitor arrays connected at different comparator inputs.
Figure 4:
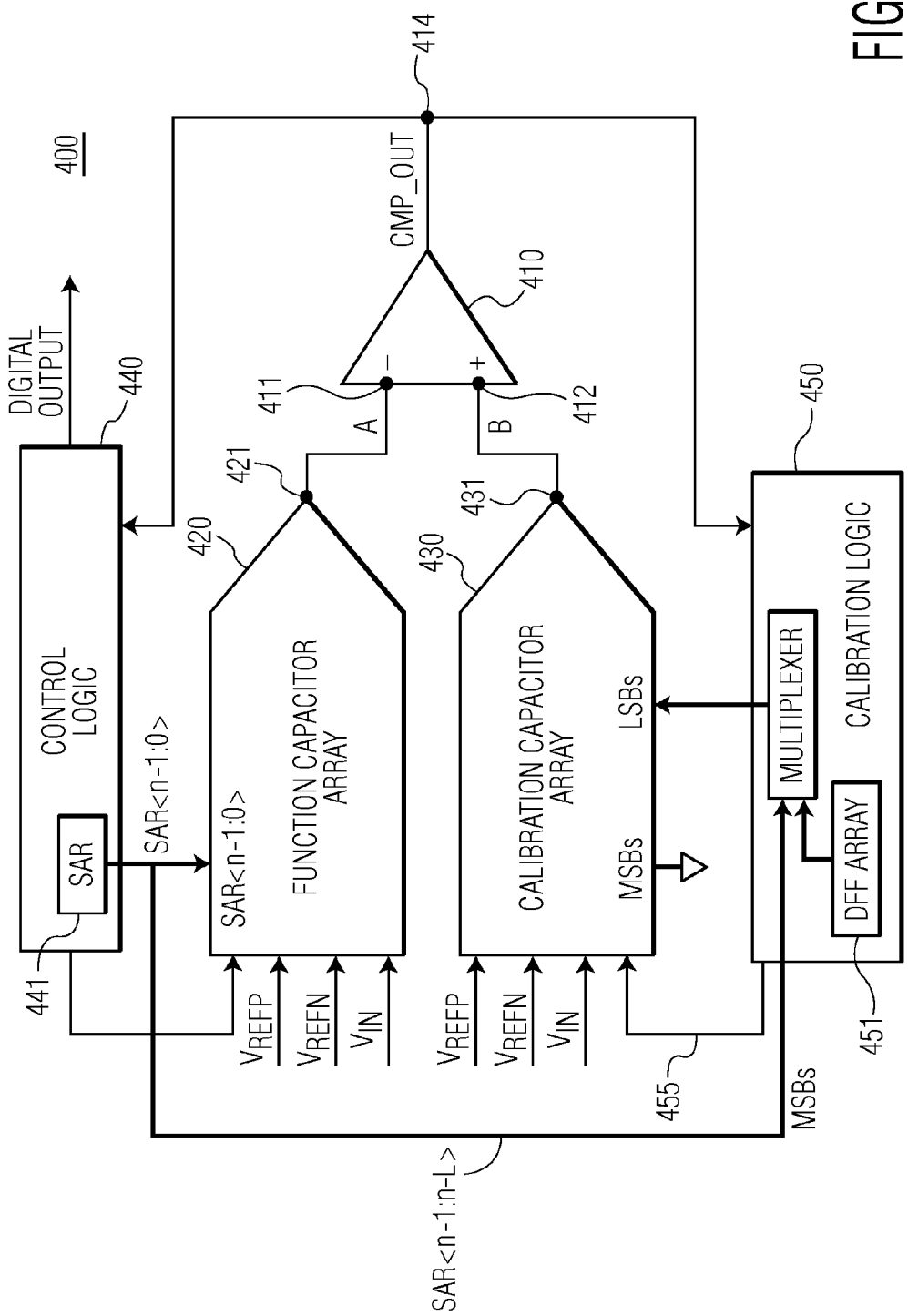
FIG. 4 is a block diagram showing one embodiment of a self-calibration method in accordance with the invention.

A. Error Detection:

FIG. 4 shows a block diagram of SAR ADC 400 with integrated self-calibration circuitry in accordance with the invention. SAR ADC 400 is comprised of comparator 410, function capacitor array 420, calibration capacitor array 430, control logic 440 and calibration logic 450. An analog input voltage "$V_{IN}$", a positive reference "$V_{REFP}$" and a negative reference "$V_{REFN}$" are supplied to both function capacitor array 420 and calibration capacitor array 430 under the control of control logic 440 and the calibration logic 450 to generate the binary search voltage and error correction voltage, respectively. The binary search voltage is the reference voltage generated by function capacitor array 420 to approach the analog input voltage step by step where the subsequent step size is half of the present step size until the difference between the analog input voltage and the reference voltage lies within "$(V_{REFP}-V_{REFN})/2^N$" and "N" is the resolution of the ADC. For example, the first reference voltage provided is "$(V_{REFP}-V_{REFN})/2$" and the second reference voltage (in the next step) provided is either "$(V_{REFP}-V_{REFN})/2^2$" or "$3(V_{REFP}-V_{REFN})/2^2$". When the first reference voltage "$(V_{REFP}-V_{REFN})/2$" is provided to function capacitor array 420, if the output of comparator 410 is "0", then the first reference voltage "$(V_{REFP}-V_{REFN})/2$" is larger than "$V_{IN}$" and the second reference should go lower to "$(V_{REFP}-V_{REFN})/2^2$"; if the output of comparator 410 is "1", then the first reference voltage "$(V_{REFP}-V_{REFN})/2$" is smaller than "$V_{IN}$" and the second reference voltage should go higher to "$3(V_{REFP}-V_{REFN})/2^2$". The error correction voltage is provided by calibration capacitor array 430 and is used to compensate the reference voltage error that is due to the offset and/or capacitor mismatch in function capacitor array 420.

Output 421 of function capacitor array 420 is connected to negative input 411 of comparator 410 and output 431 of calibration capacitor array 430 is connected to positive input 412 of comparator 410. The difference between outputs 421 and 431 determines comparator output 414, which is fed back to control logic 440 to control the successive approximation registers (SAR) 441 implementing the binary search algorithm in normal conversion mode, and back to calibration logic 450 to control the error searching process and create error correction codes stored in DFF array 451 in calibration mode.

Figure 5:
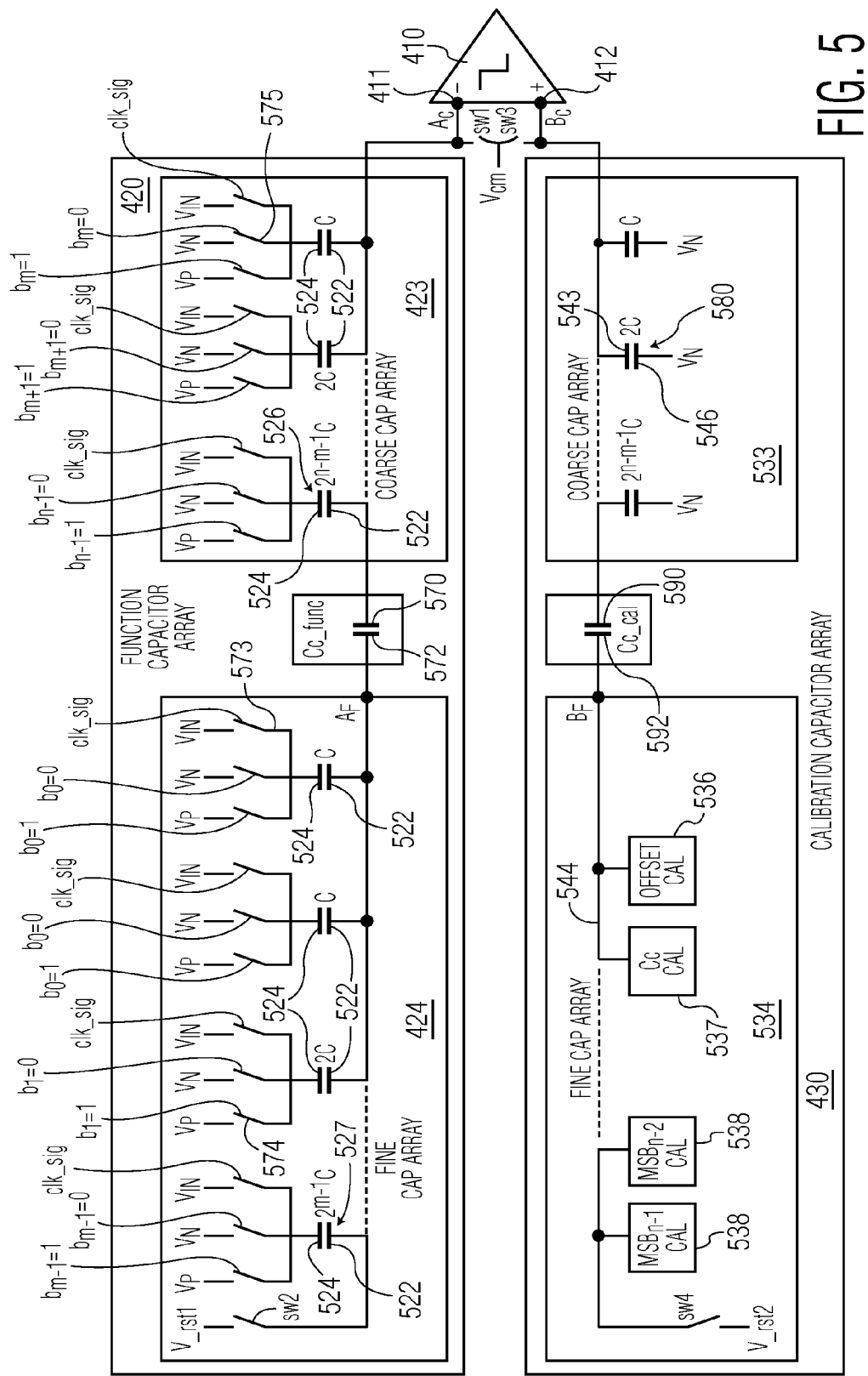
FIG. 5 is a circuit diagram showing the structure of a binary weighted charge redistribution function DAC and calibration DAC in accordance with the invention.

In order to achieve high resolution while keeping the die size as small as possible, both function capacitor array 420 and calibration capacitor array 430 are each divided into two parts (see FIG. 5) coarse capacitor arrays 423 and 533 and fine capacitor arrays 424 and 534, respectively, each of which is composed of a plurality of binary-weighted capacitors as shown in FIG. 5. Top plates 522 of binary-weighted capacitor cells 526 in coarse function capacitor array 423 are connected in common to bottom plate 570 of the coupling capacitor "$C_{c\_func}$". Top plates 522 of the binary weighted capacitor cells 527 in fine function capacitor arrays 424 are connected in common to top plate 572 of the coupling capacitor "$C_{c\_func}$". Bottom plate 524 of each capacitor cell 526 and 527 in function capacitor array 420 is connected to a plurality of switches 573, 574 and 575 at one terminal and the other terminals of these switches 573, 574 and 575 are connected to the analog input "$V_{IN}$", the positive and negative references "$V_P$" and "$V_N$", respectively, under the control of the sampling clock "clk_sig" and the digital bits "b<i>" and "bn<i>" coming from SAR 441 in control logic 440, respectively. Binary weighted capacitor cells 526 in coarse function capacitor array 423 are controlled by the "n-m" MSBs (most significant bits) of the "b<n-1:0>" and binary weighted capacitor cells 527 in fine function capacitor array 424 are controlled by "m" LSBs (least significant bits), where "n" is the resolution of SAR ADC 400 shown in FIG. 4.

Figure 6A:
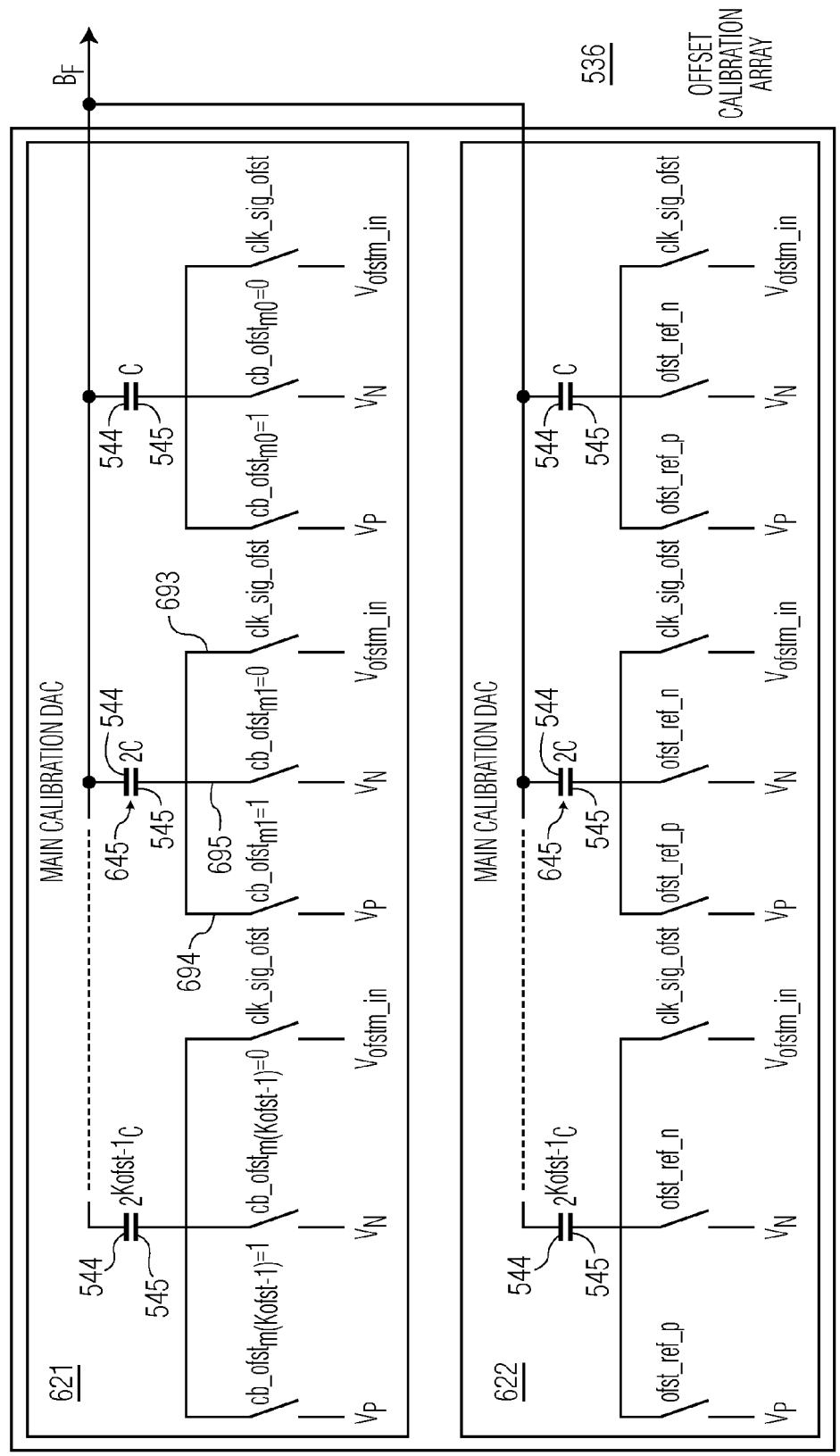
FIG. 6a is a circuit diagram showing the structure of an offset calibration array including a sub main calibration array and a sub auxiliary calibration array in accordance with the invention.
Figure 6B:
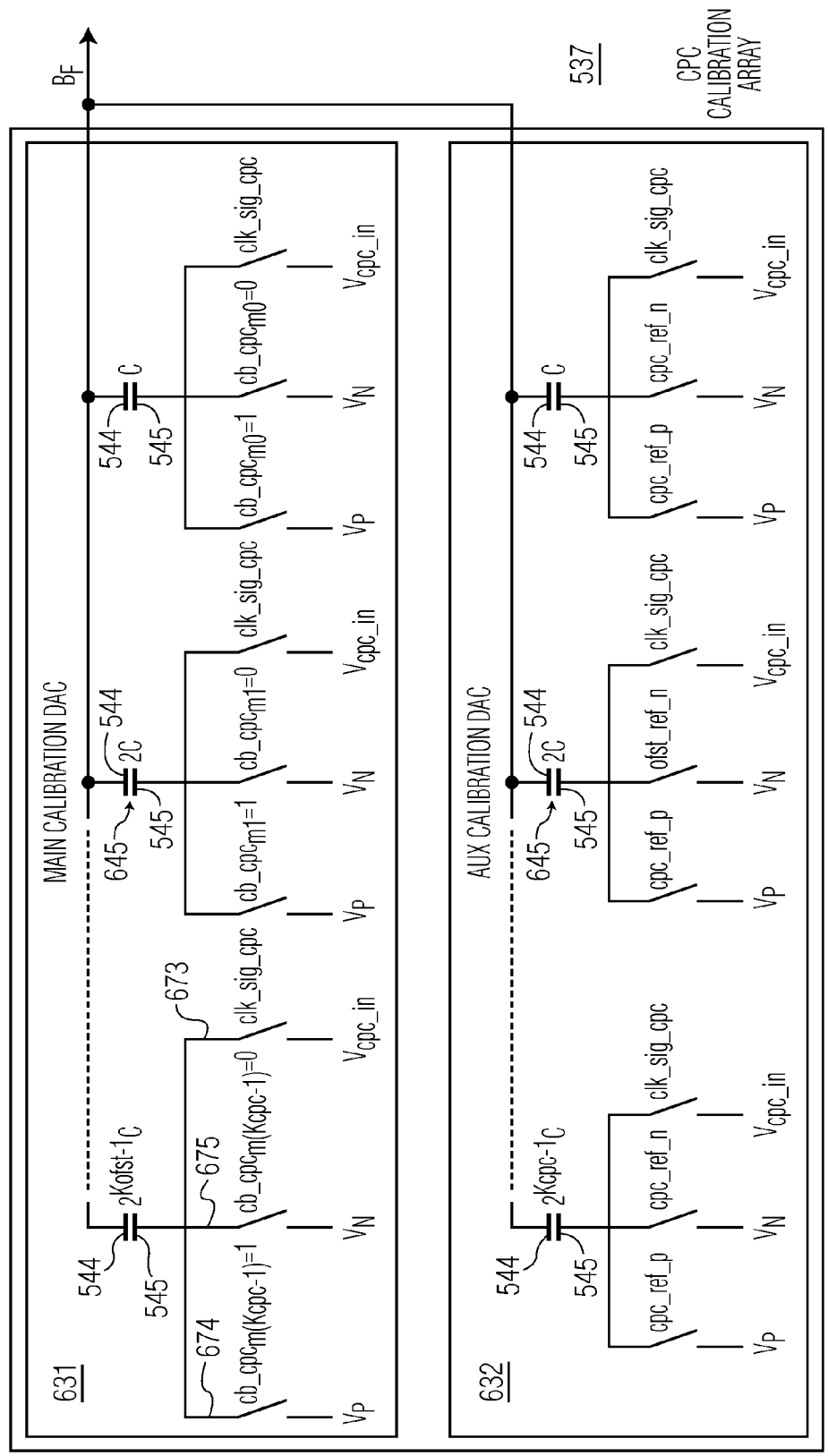
FIG. 6b is a circuit diagram showing the structure of a CPC calibration array including a sub main calibration array and a sub auxiliary calibration array in accordance with the invention.
Figure 6C:
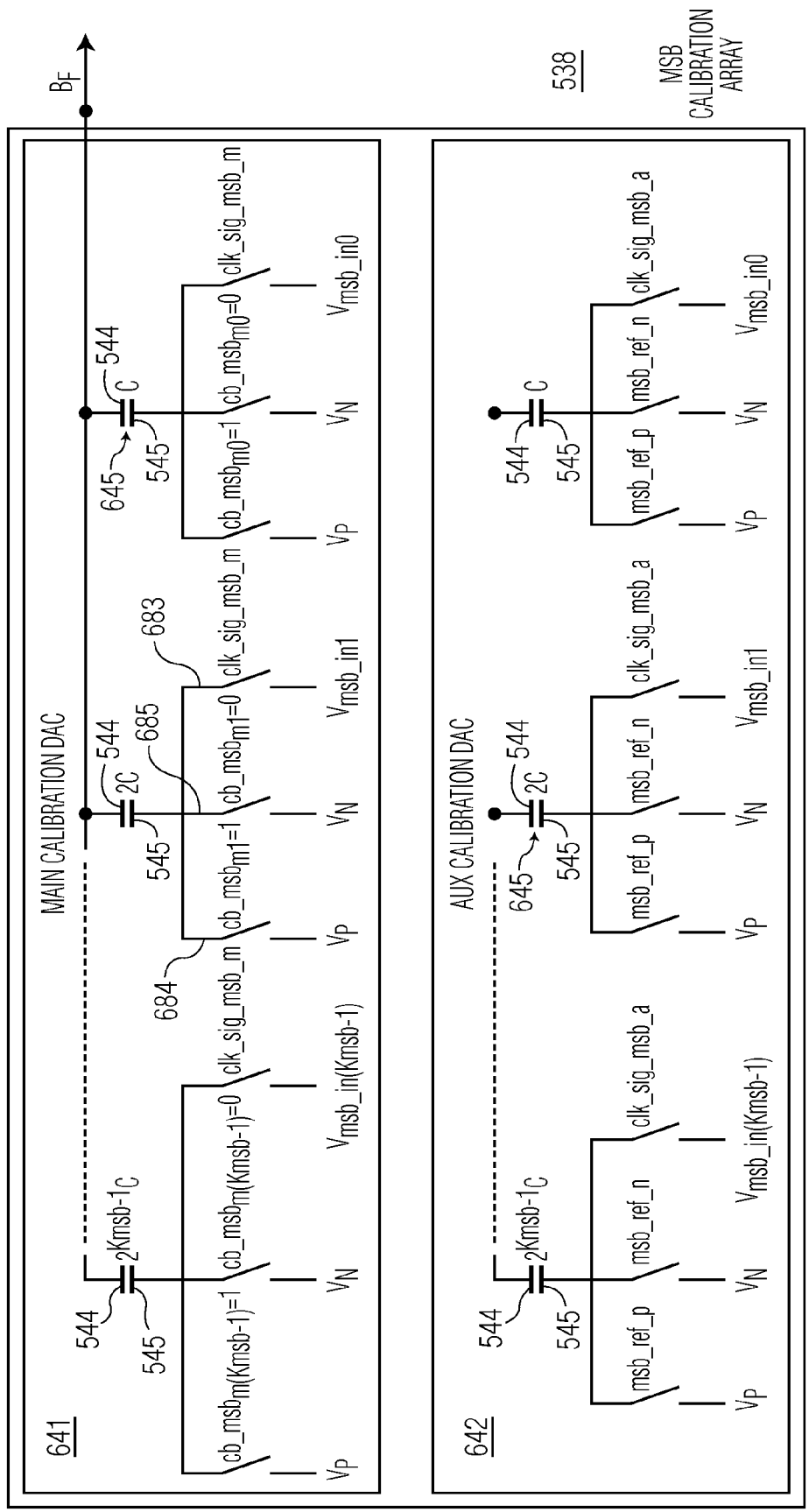
FIG. 6c is a circuit diagram showing the structure of an MSB calibration array including a sub main calibration array and a sub auxiliary calibration array in accordance with the invention.

Top plates 543 of binary weighted capacitor cells 580 in coarse calibration capacitor array 533 are connected in common to bottom plate 590 of the coupling capacitor "$C_{c\_cal}$". The capacitance of "$C_{c\_cal}$" is equal to that of "$C_{c\_func}$". Bottom plates 546 of binary weighted capacitor cells 580 in coarse calibration capacitor array 533 are connected in common to the alternating current ground, such as negative reference "$V_N$". Fine calibration capacitor array 534 is divided into offset calibration array 536, coupling capacitor calibration array 537 and multi MSB capacitor calibration arrays 538. Each of the calibration arrays 536, 537 and 538 consists of one sub-main calibration array and one sub-auxiliary calibration array as shown in FIGS. 6a-c. "$K_{ofst}$", "$K_{cpc}$", and "$K_{msb}$" are the numbers of the offset calibration bits, couple capacitor "$C_{c\_func}$" calibration bits and the MSB calibration bits, respectively. Top plates 544 of the binary weighted capacitor cells in each calibration array 536, 537 and 538 share the same node, which is connected to top plate 592 of coupling capacitor "$C_{c\_cal}$". Each bottom plate 545 of the binary weighted capacitor cells 645 in each calibration array 536, 537 and 538 is connected to a plurality of switches for switching between an analog pre-set value of "$V_{ofstm\_in}$", "$V_{ofsta\_in}$", "$V_{cpc\_in}$", "$V_{msb\_in(i)}$" and positive and negative references "$V_P$" and "$V_N$", respectively (see FIGS. 6a-c).

Figure 7:
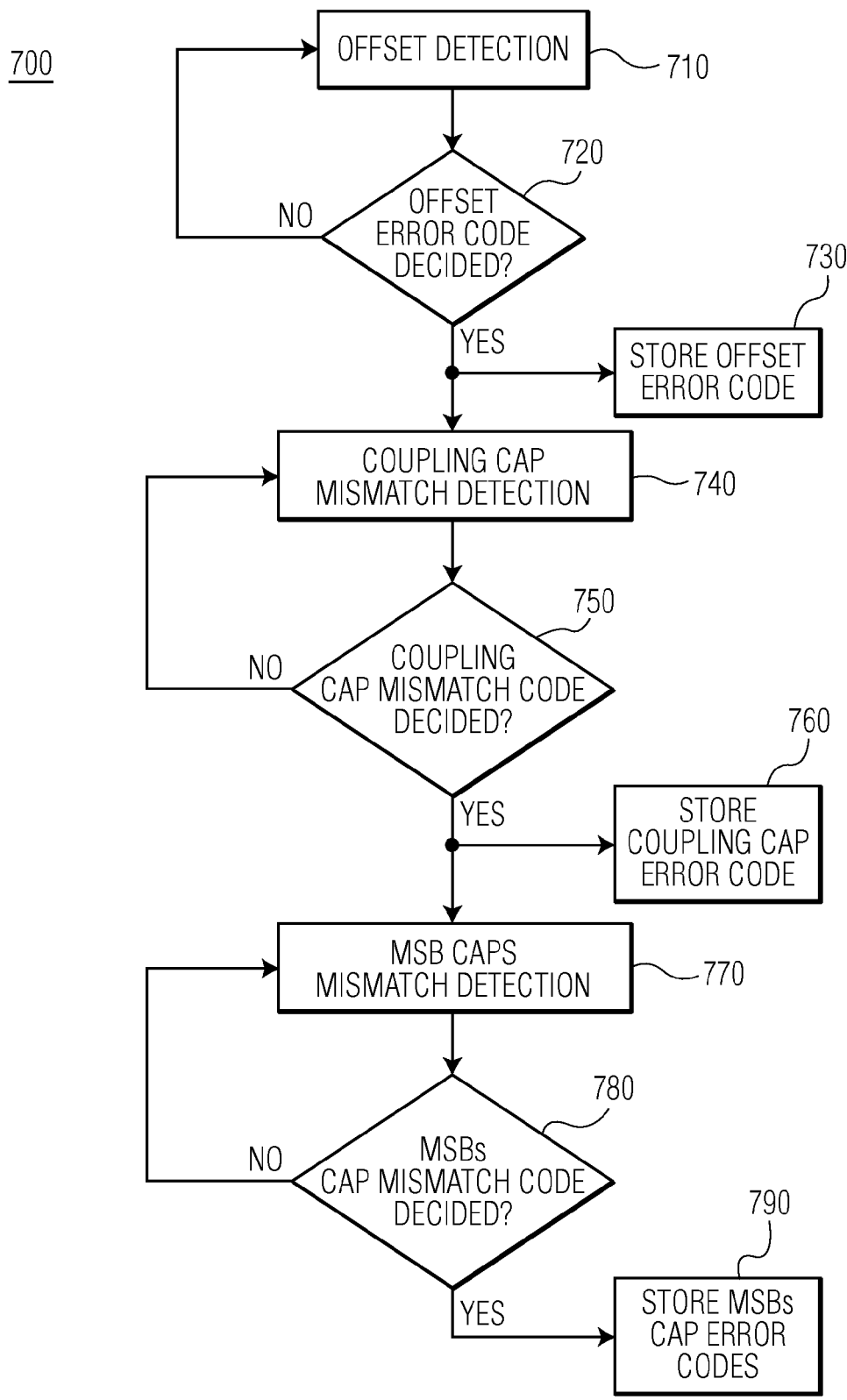
FIG. 7 is a flow chart showing the error detection procedure of the self-calibration method in accordance with the invention.

The calibration procedure starts with the error detection process, which detects the offset error, the coupling capacitor mismatch error and the MSBs capacitors mismatch errors in sequence as shown in FIG. 7, and stores the error coefficients in the storage cells, such as DFF array 451, followed by the error correction process, which occurs during the normal conversion mode. ADC 400 has two operational modes: calibration mode and normal conversion mode. Before ADC 400 performs the analog to digital conversion (normal conversion mode), ADC 400 must be initially calibrated. In calibration mode, the error detection process determines the necessary error correction codes. Then operation switches to the normal conversion mode. In normal conversion mode, function capacitor array 420 provides the reference voltage level to approach the analog input voltage step by step and at substantially the same time calibration capacitor array 430 provides the error correction voltage based on the error correction codes in order to compensate each error.

The calibration procedure starts with error detection process 700 shown in FIG. 7. In step 710, the offset detection process is performed and if, in step 720, the offset error code is determined, the offset error code is stored in step 730. Next in step 740, the coupling capacitor mismatch detection process is performed and if, in step 750, the coupling capacitor mismatch code is determined, the coupling capacitor error code is stored in step 760. Then in step 770, the MBSs capacitors mismatch errors detection process is performed and if, in step 780, the MSBs capacitor mismatch errors are determined, the MSBs capacitor error codes are stored in step 790.

During the offset detection process in step 710, the analog input "$V_{IN}$" is set equal to the negative reference "$V_N$" and the digital inputs "b<n-1:0>" to function capacitor array 420 are set to ground. The switches "sw1" and "sw2" connected to comparator input 411 and node "$A_F$" are turned on (see FIG. 5) setting top plates 522 of capacitors 526 and 527 in coarse function capacitor array 423 and fine function capacitor array 424 to constant voltages "$V_{cm}$" and "$V_{\_rst1}$", respectively. Meanwhile, bottom plates 524 of capacitors 526 and 527 are connected to "$V_{IN}$". Then the switches "sw1" and "sw2" are turned off leaving comparator input 411 and node "$A_F$" floating, and bottom plates 524 are switched to the negative reference "$V_N$" with bits "b<n-1:0>" set to "0". The voltage variation "$(V_N-V_{IN})+\Delta V1$" at bottom plates 524 is coupled to the negative input 411 of comparator 410, where "$V_N-V_{IN}=0$" and "$\Delta V1$" is the offset voltage due to the charge injection effect and clock feed-through effect of switches 573, 574 and 575 connected to bottom plates 524. The switches "sw3" and "sw4" connected to comparator input 412 and node "$B_F$" are synchronized with switches "sw1" and "sw2" setting top plates 543 of capacitors 580 and top plates 544 of capacitors 645 in coarse calibration capacitor array 533 and fine calibration capacitor array 534 to constant voltages "$V_{cm}$" and "$V_{\_rst2}$", respectively. At the same time, bottom plates 545 of each capacitor 645 in fine calibration capacitor array 534 is connected to a voltage equal to "$(V_P+V_N)/2$" ($V_{ofstm\_in}=V_{ofsta\_in}=(V_P+V_N)/2$). When the switches "sw3" and "sw4" are off, bottom plates 545 of sub-main offset calibration array 621 and sub-auxiliary offset calibration array 622 are charged to the opposite voltage references ("$V_P$" and "$V_N$") to compensate for the voltage variation with respect to each other and to make the voltage variation at positive comparator input 412 close to zero. This is the initial state setup for offset calibration capacitor array 536. This assures that the initial voltage variation at node "$B_F$" in FIG. 5 is zero when "sw3" and "sw4" are in the off position. Comparator output 414 in the initial state represents the polarity of the offset voltage, designated as "$DP_{offset}$". "$DP_{offset}$" is stored in DFF (data flip-flop) array 451. Then bottom plates 545 of all the capacitors in sub-auxiliary offset calibration array 622 keep the set reference value, while bottom plates 545 of each capacitor cell 645 in sub-main offset calibration array 621 is switched to the positive/negative reference determined by the sign of the comparator differential inputs "$\Delta V_{off}=V_{Bc}-V_{Ac}$", one by one from "C" to "$2^{(Kofst-1)}C$" create the step voltage shown in FIG. 8b for "$\Delta V_{off}<0$" and in FIG. 8c for "$\Delta V_{off}>0$" at comparator input 412 (node "$B_C$") approaching to the voltage at comparator input 411 (node "$A_C$") where "$\Delta V_{off}=\Delta V1+\Delta V2+\Delta V3$" ("$\Delta V2$" presents the offset voltage due to the mismatch between the charge injection effect and clock feed-through effect of the switch "sw1" and the "sw3", and "$\Delta V3$" represents the comparator input-referred offset). FIG. 8a shows "$\Delta V_{off}=0$". Comparator 410 compares each step voltage with the voltage at comparator input 411 (node "$A_C$"), until output 414 of comparator 410 toggles. The final digital codes "$cb\_ofst_{m(Kofst-1)}$ ... $cb\_ofst_{m0}$" controlling the switches 694 and 695 connected to bottom plates 545 of capacitors 645 in sub-main offset calibration array 621 are the offset error coefficients. The offset error coefficients are stored in DFF array 451. The final differential voltage shown at comparator inputs 411 and 412 is the calibration error due to the digitized calibration step size determined by the calibration resolution.

Figure 9A:
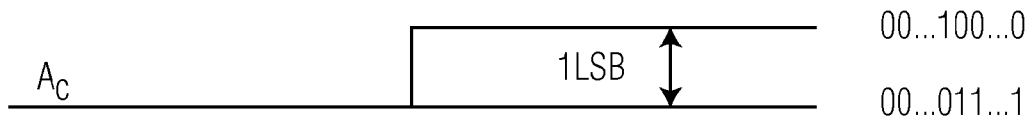
FIG. 9 is a waveform diagram showing the error detection procedure for positive and negative capacitor mismatch errors in accordance with the invention.
Figure 9B:
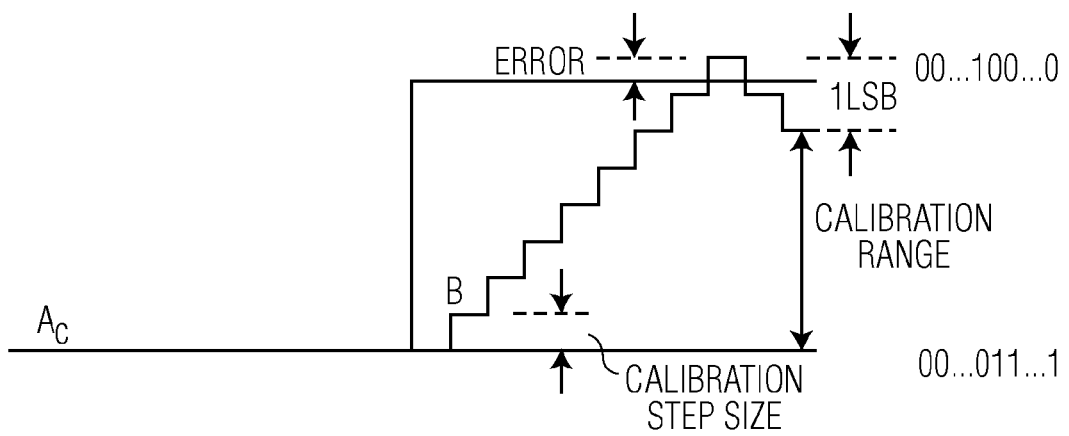
Figure 9C:
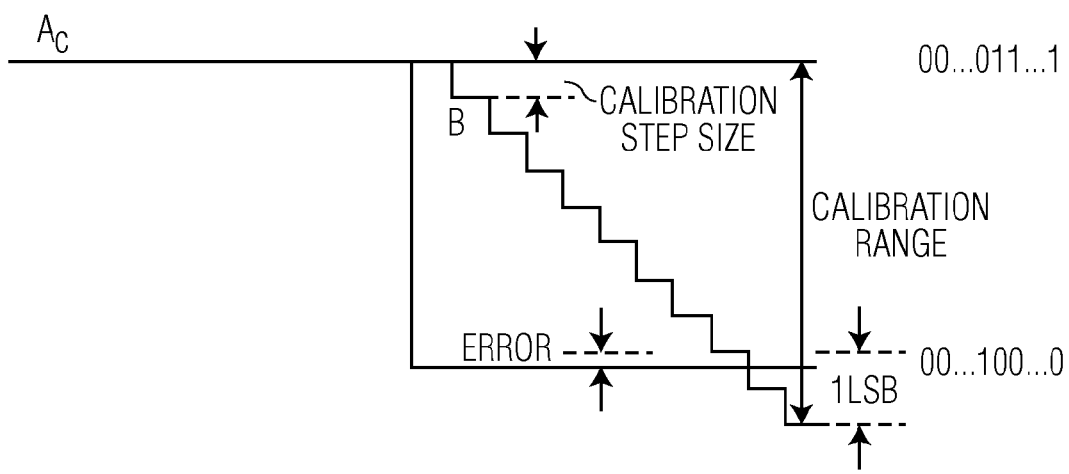

Following the offset detection, the coupling capacitor "$C_{c\_func}$" (see FIG. 5) calibration starts. Assume all the mismatch errors from capacitors 527 in fine function capacitor array 424 and the capacitor labeled "C" controlled by the least significant bit "b<m>" in coarse function capacitor array 423 meet the resolution requirement and that the capacitors under calibration are all in coarse function capacitor array 423. This assumption is reasonable because the mismatch errors in fine function capacitor array 424 are divided by the total number "$2^{n-m}$" (where "n" is the resolution of ADC 400 and "m" is the resolution of the fine function capacitor array 424) of the unit capacitors "C" in coarse function capacitor array 423 before it is fed to comparator input 411, while the mismatch errors in coarse function capacitor array 423 are added to comparator input 411 directly without being scaled down. During coupling capacitor "$C_{c\_func}$" calibration, the analog input "$V_{IN}$" is grounded. The switches "sw1" and "sw2" are turned on forcing comparator input 411 and node "$A_F$" to the constant voltages "$V_{cm}$" and "$V_{\_rst1}$", respectively. The digital inputs "b<n-1:m>" to coarse function capacitor array 423 are set to "0"s, charging bottom plates 524 of capacitors 526 in coarse function capacitor array 423 to negative reference voltage "$V_N$". The digital inputs "b<m-1:0>" to fine function capacitor array 424 are set to "1"s, charging bottom plates 524 of capacitors 527 in fine function capacitor array 424 to positive reference voltage "$V_P$". When the "sw1" and "sw2" switch from on to off, the digital inputs "b<n-1:m+1>" to coarse function capacitor array 423 are kept as "0"s and the bit "b<m>", the least significant bit in coarse function capacitor array 423, switches from "0" to "1" changing the bottom plates 524 connection of the capacitor cell controlled by "b<m>" to positive reference voltage "$V_P$". The digital inputs "b<m-1:0>" to fine function capacitor array 424 switch from "1"s to "0"s changing bottom plates connections 524 of the capacitor cells in the fine function capacitor array 424 to negative reference voltage "$V_N$". The digital bits "b<m:0>" involved in the switching introduce "1LSB" voltage variation at comparator input 411 (node "$A_C$") as shown in FIG. 9a, where the "1LSB" is defined as "$(V_P-V_N)/2^n$" where n is the resolution of ADC 400. Additional voltage variation, "$\Delta Vc$", shown at comparator input 411 (node "$A_C$") is from the mismatch of coupling capacitor "$C_{c\_func}$". The switches "sw3" and "sw4" are synchronized with switches "sw1" and "sw2" setting top plates 543 and 544 of capacitors 580 and 645 in both coarse calibration capacitor array 533 and fine calibration capacitor array 534 to the constant voltages "$V_{cm}$" and "$V_{\_rst2}$", respectively. Meanwhile, bottom plate 545 of each capacitor 645 in fine calibration capacitor array 534 is connected to the voltage equal to "$(V_P+V_N)/2$". When the switches "sw3" and "sw4" are off, bottom plates 545 of sub-main coupling capacitor calibration array 631 and sub-auxiliary coupling capacitor calibration array 632 are charged to the opposite references "$V_P$" and "$V_N$", balancing the voltage variation shown at the comparator input 412 (node "$B_C$") from coupling capacitor calibration array 537 close to zero. This is the initial state setup for coupling capacitor calibration array 537. Comparator output 414 in the initial state represents the preliminary polarity of the "$C_{c\_func}$" mismatch, designated as "$DP_{Cc}$". It is stored in DFF 451. Then, offset compensation voltage "$\Delta V_{off}$" is generated by offset calibration array 536 according to the offset error coefficients stored in DFF array 451 and provided at comparator input 412 (node "$B_C$") to remove the offset error. Bottom plates 545 of all capacitors 645 in sub-auxiliary coupling capacitor calibration array 632 keep the reference value set in the initial state, while bottom plate 545 of each capacitor cell 645 in sub-main coupling capacitor calibration array 631 is switched to the positive/negative reference determined by the preliminary polarity of comparator differential inputs 411 and 412, one by one from "C" to "$2^{(Kcpc-1)}C$" where "Kcpc" is the number of "$C_{c\_func}$" calibration bits to create the step voltage at comparator input 412 (node "$B_C$") approaching to the voltage at comparator input 411 (node "$A_C$") shown in FIGS. 9b and 9c. Comparator 410 compares each step voltage with the voltage at comparator input 411 (node "$A_C$"), until its output toggles. The step curve then goes to either the opposite direction as shown in FIG. 9(b) when "$C_{c\_func}<C_{cideal}$" (where "$C_{cideal}$" is the expected value for "$C_{c\_func}$") or the same direction as shown in FIG. 9(c) when "$C_{c\_func}>C_{cideal}$" by decreasing/increasing the digital inputs "cb_cpc$_m$<Kcpc-1:0>" to sub-main coupling capacitor calibration array 631 to create about "1LSB" difference between comparator input 411 (node "$A_C$") and comparator input 412 (node "$B_C$") considering calibration error. Note, "$A_C - B_C = 1LSB$" is the ideal case. Because the calibration step size is not infinitesimal, the real case is "$A_C-B_C = 1LSB - error$". In FIG. 9b, the range indicated by "1LSB" includes both the voltage difference between node "$A_C$" and node "$B_C$" and the "error". The final polarity of the mismatch error is same as the preliminary one if the curve keeps the original direction and reversed if the curve goes in the opposite direction and the final voltage level is lower than its initial value. The last digital codes "cb_cpc$_{m(Kcpc-1)}$ ... cb_cpc$_{m0}$" controlling switches 674 and 675 that are connected to bottom plates 545 of capacitors 645 in sub-main coupling capacitor calibration array 631 are the coupling capacitor mismatch error coefficients. They are stored in DFF array 451.

Once the coupling capacitor mismatch error detection is done, the state machine built in calibration logic 450 starts the MSBs (Most Significant Bits) capacitors mismatch error detection. Assume that there are "L" capacitor cells in coarse function capacitor array 423 that need to be calibrated. They are designated as "$2^{n-m-1}C \pm \Delta C_{n-m-1}$, $2^{n-m-2}C \pm \Delta C_{n-m-2}$ ... $2^{n-m-L}C \pm \Delta C_{n-m-L}$" and controlled by the digital bits "$b_{n-1}, b_{n-2} \ldots b_{n-L}$", respectively. The MSBs mismatch error detection process 770 begins with searching for the mismatch of the capacitor cell under the control of the lowest bit "$b_{n-L}$" and goes one by one to the capacitor cell under the control of the most significant bit "$b_{n-1}$". During the "$\Delta C_{n-m-L}$" (defined as "$\Delta C_{n-m-L} = 2^{n-m-L}C - C_{n-m-1\_ideal}$" where "$C_{n-m-1\_ideal}$" is the theoretical value for "$2^{n-m-L}C$") mismatch error detection process for the capacitor with the value of $2^{n-m-L}C$ under control of bit $b_{n-L}$, the analog input "$V_{IN}$" is grounded. When the switches "sw1" and "sw2" are on, top plates 522 of coarse capacitor array 423 and of fine capacitor array 424 of function capacitor array 420 are set to the constant voltages "$V_{cm}$" and "$V_{\_rst1}$", respectively. The digital inputs "b<n-1:0>" to function capacitor array 420 are set to "000 . . . 0111 . . . 1", where the digital bits lower than "$b_{n-L}$" are set to "1"s and bit "$b_{n-L}$" and the bits higher than "$b_{n-L}$" are all set to "0"s. Therefore, bottom plates 524 of capacitor cells controlled by digital bits "b<n-L-1:0>" are charged to the positive reference level "$V_P$" and bottom plates 524 of the capacitor cells controlled by digital bits "b<n-1:n-L>" are charged to the negative reference level "$V_N$". When the switches "sw1" and "sw2" switch from the on state to the off state, the digital inputs "b<n-1:0>" switch to "000 . . . 1000 . . . 0", where the digital bits lower than "$b_{n-L}$" switch from "1"s to "0"s, the bit "$b_{n-L}$" switches from "0" to "1" and the bits higher than "$b_{n-L}$" keep their original settings. Therefore, bottom plates 524 of the capacitor cells controlled by digital bits "b<n-L-1:0>" are discharged to negative reference level "$V_N$", and bottom plate 524 of the capacitor cell controlled by "$b_{n-L}$" is charged to positive reference level "$V_P$". Bottom plates 524 of the capacitor cells controlled by digital bits "b<n-1:n-L+1>" keep the original connections. The overall voltage coupled to the comparator input 411 (node "$A_C$") due to the "n-L+1" capacitor cells bottom plate connections switching is equal to "$1LSB + \Delta V_{n-L} + \Delta V_{off} + \Delta Vc$", where the "1LSB" is from the one bit digital inputs variation ("0001000 . . . 0"-"000 . . . 0111 . . . 1"=1), "$\Delta V_{n-L}$" is the error voltage from the capacitor mismatch "$\Delta C_{n-m-L}$" and "$\Delta V_{off} + \Delta Vc$" are the system offset and the coupling capacitor mismatch error, respectively. The switches "sw3" and "sw4" are synchronized with switches "sw1" and "sw2". When "sw3" and "sw4" are on, top plates 543 and 544 of the capacitor cells in calibration array 430 are set to the constant voltages "$V_{cm}$" and "$V_{\_rst2}$", respectively. Bottom plate 545 of each capacitor 645 in fine calibration capacitor array 534 is connected to the voltage equal to "$(V_P+V_N)/2$". When the switches "sw3" and "sw4" are off, bottom plates 545 of sub-main "$b_{n-L}$" MSB capacitor calibration array 641 and sub-auxiliary "$b_{n-L}$" MSB capacitor calibration array 642 are charged to the opposite references balancing the voltage variation shown at comparator input 412 (node "$B_C$") from the "$b_{n-L}$" MSB capacitor calibration array 538 close to zero. It is called the initial state setup for the "$b_{n-L}$" MSB capacitor calibration array 538. Comparator output 414 in the initial state represents the preliminary polarity of the "$\Delta C_{n-m-L}$" mismatch, designated as "$DP_{MSB(n-m-L)}$". It is stored in DFF array 451.

Then, the offset and the coupling capacitor mismatch compensation voltages "$\Delta V_{off}$" and "$\Delta Vc$", are generated by offset calibration array 536 and coupling capacitor calibration array 537, respectively, according to the offset error coefficients and coupling capacitor mismatch error coefficients stored in DFF array 451 and provided at comparator input 412 (node "$B_C$") to remove the systematic offset and the coupling capacitor "Cc_func" mismatch error. Bottom plates 545 of all capacitors 645 in sub-auxiliary "$b_{n-L}$" capacitor calibration array 642 keep the reference value set in the initial state, while bottom plate 545 of each capacitor cell 645 in sub-main "$b_{n-L}$" capacitor calibration array 641 is switched to the positive/negative reference determined by the preliminary polarity of comparator differential inputs 411 and 412, one by one from "C" to "$2^{(Kmsb(n-m-L)-1)}C$" so that the step voltage at comparator input 412 (node "$B_C$") approaches the voltage at comparator input 411 (node "$A_C$") as shown in FIG. 9a. Comparator 410 compares each step voltage with the voltage at comparator input 411 (node "$A_C$"), until its output toggles. The step curve then goes to either the opposite direction as shown in FIG. 9(b) when "$\Delta C_{n-m-L} > 0$" or the same direction shown as FIG. 9(c) when "$\Delta C_{n-m-L} < 0$" by decreasing/increasing the digital inputs "$cb\_msb_{m((msb(n-m-L)-1)}$ . . . $cb\_msb_{m0}$" to sub-main MSB calibration array 641 to create about a "1LSB" difference between comparator input 411 (node "$A_C$") and comparator input 412 (node "$B_C$") including the calibration error. The final polarity of the mismatch error is same as the preliminary one if the curve keeps the original direction and reversed if the curve goes to the opposite direction and the final voltage level is lower than its initial value. The last digital codes "$cb\_msb_{m(Kmsb(n-m-L)-1)}$ . . . $Cb\_msb_{m0}$" controlling switches 684 and 685 which are connected to bottom plates 545 of capacitors 645 in sub-main "$b_{n-L}$" MSB capacitor calibration array 641 are the "$\Delta C_{n-m-L}$" mismatch error coefficients. They are stored in a separate location of DFF array 451.

Note that "n" is the resolution of ADC 400, "m" is the resolution of fine capacitor arrays 424 and 534 and "n-m" is the resolution of the coarse capacitor arrays 423 and 533. "L" is the number of MSBs that need to be calibrated. Typically, the bit under calibration is from MSB to LSB. For example, for a 12-bit resolution (bit<11:0>) ADC, four bits need to be calibrated. These four bits are bit<11>, bit<10>, bit<9> and bit<8>. As shown in FIG. 5, the capacitor value under the control of MSB-bit<n-1> is $2^{n-m-1}C$, so the capacitors under control of the following MSBs: MSB-bit<n-2> . . . MSB-bit<n-L>, for calibration are the $2^{n-m-2}C$, $2^{n-m-3}C$, . . . $2^{n-m-L}C$ capacitors. The capacitor and the calibration bit with subscripts-n-m-L represents the last MSB that needs to be calibrated. "Kmsb" represents the number of the calibration bits for each MSB. For example, "Kmsb(n-m-1)" represents the number of calibration bits for capacitor "$2^{n-m-1}C$" which is under the control of MSB-b<n-1>, and "Kmsb(n-m-L)" represents the number of calibration bits for cap "$2^{n-m-L}C$" under the control of MSB-bit<n-L>.

The same procedure repeats for the rest of the "b<n-1, n-L+1>" capacitor cells mismatch error detection from "b<n-L+1>" (lower MSB) to "b<n-1>" (higher MSB) bit by bit, except that the mismatch compensation voltages for the calibrated MSBs that are lower than the MSB currently under calibration, have to be generated by MSB calibration arrays 538 assigned to the calibrated MSBs and coupled to comparator input 412 (node "$B_C$") with the opposite polarities to compensate for the mismatch from the calibrated MSB capacitor cells before the step voltage searching curve for the current MSB capacitor cell is created. The reason for the polarity change is that in the calibrated MSB capacitor cells mismatch error detection process, the digital inputs to function capacitor array 420 controlling the calibrated MSB capacitor cells switch from "0"s to "1"s, while in the current MSB capacitor cell mismatch error detection process, these digital inputs switch from "1"s to "0"s. Once all of the MSB capacitor cells mismatch errors have been detected, the error coefficients for the different MSB capacitor cells are stored in the different locations of DFF array 451. In the normal conversion mode, these error coefficients combined with the error coefficients for the offset and coupling capacitor mismatch are used to control MSBs calibration array 538, offset calibration array 536 and coupling capacitor calibration array 537 providing the error compensation voltages to positive comparator input 412.

B. Error Correction:

The error correction process is merged into the normal conversion mode. In the normal conversion mode, function capacitor array 420 works as a capacitive DAC, which provides the difference between the analog input and the reference level to negative input 411 of comparator 410 under the control of SAR logic 441. Calibration capacitor array 430 works as a calibration DAC, which provides the error correction voltage to positive input 412 of comparator 410 under the control of calibration logic 450. The error correction voltage compensates the system offset, the coupling capacitor mismatch and the MSB capacitor cells mismatch at differential inputs 411 and 412 of comparator 410 and leaves comparator output 414 free from errors.

The detailed operation is as follows. In the sampling mode, the switches controlled by "clk_sig" 573 are turned on and the analog input under conversion is sampled to the bottom plates 524 of capacitors 526 and 527 in function capacitor array 420. The top plates 522 are set to the constant voltages "$V_{cm}$" and "$V_{rst1}$", respectively, by turning switches "sw1" and "sw2" on as shown in FIG. 5. When switching to the comparison mode, the switches "sw1" and "sw2" are turned off and bottom plates 524 of capacitors 526 and 527 in function capacitor array 420 are switched to the positive/negative references based on the digital bits "$b_{n-1}, \ldots b_0$" setup. When the digital bit is set to "1", switch 574 connected to positive reference "$V_P$" is turned on. When the digital bit is set to "0", switch 575 connected to negative reference "$V_N$" is turned on. Each combination of the bits "$b_{n-1}, \ldots b_0$" decides one reference level. The reference level goes step by step approaching the analog input. For each step, the difference between the analog input and the reference level is coupled to comparator negative input 411 (node "$A_C$"). Top plates 543 of capacitors 580 in the coarse calibration array 533 and top plates 544 of capacitors 645 in fine calibration array 534, are set to "$V_{cm}$" and "$V_{\_rst2}$", respectively, by turning on switches "sw3" and "sw4" simultaneously with switches "sw1" and "sw2" in the sampling mode and left floating by turning switches "sw3" and "sw4" off in the comparison mode. The error correction voltages generated from different calibration arrays 536 and 538 are coupled to comparator positive input 412 (node "$B_C$") synchronized with the binary search process and compared with the step voltages present at negative input 411 (node "$A_C$").

Offset calibration array 536 provides the offset correction voltage to positive input 412 of comparator 410 through the entire binary search process. In the sampling mode, bottom plates 545 of the capacitors in sub-main offset calibration array 621 are connected to "$V_{ofstm\_in}$" via switch 693. "$V_{ofstm\_in}$" is set to the negative reference "$V_N$", when the offset polarity indication bit "$DP_{offset}$" is "0", or is set to the positive reference "$V_P$", when the offset polarity indication bit "$DP_{offset}$" is "1". In the comparison mode, the bottom plates 545 of capacitors 645 in sub-main offset calibration array 621 either keep the initial reference level, if the offset error coefficient bits controlling switches 694 and 695 connected to bottom plates 545 are "0"s, or are charged to the reference level opposite to initial setup, if the offset error coefficient bits controlling switches 693, 694 and 695 connected to bottom plates 545 are "1"s. The voltage variation due to the connection changes at bottom plates 545 of capacitors 645 in sub-main offset calibration array 541 is coupled to comparator input 412 (node "$B_C$") creating the offset error correction voltage. There is no offset compensation contributed from sub-auxiliary offset calibration array 622, because no capacitor switching operation occurs in normal conversion mode.

Figure 10:
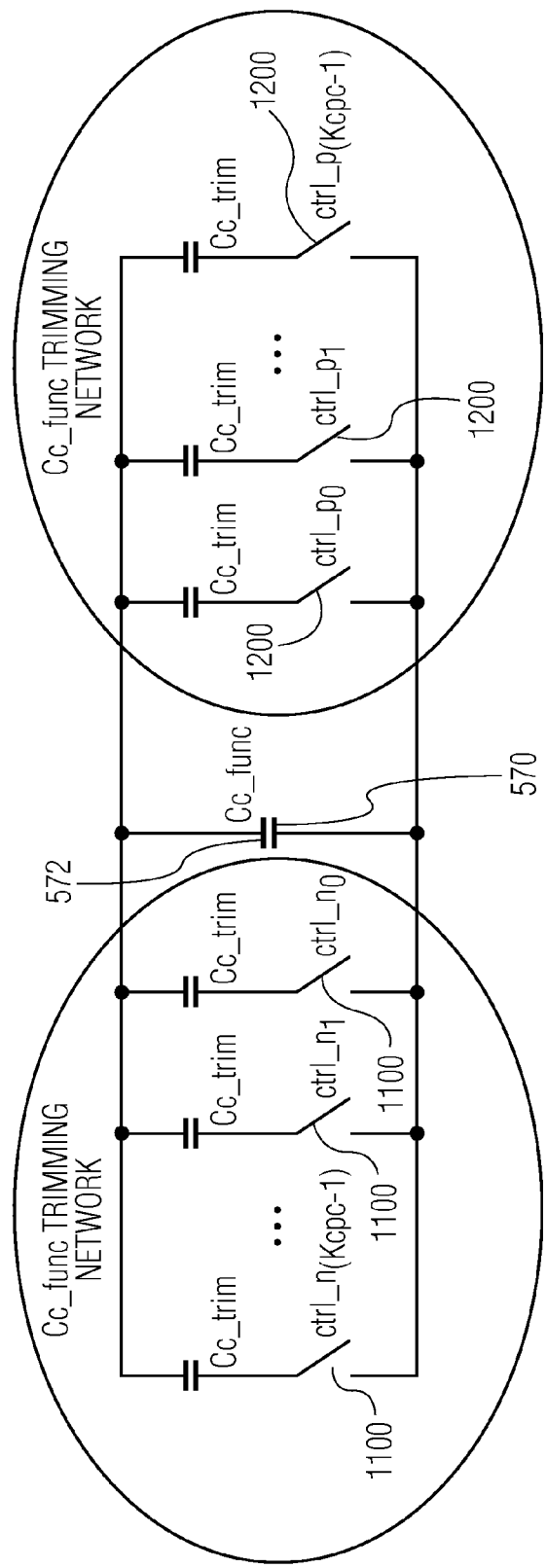
FIG. 10 is a block diagram showing the coupling capacitor trimming network in accordance with the invention.

As shown in FIG. 10, coupling capacitor "$C_{c\_func}$" mismatch can be calibrated by putting trimming capacitors "$C_{c\_trim}$" in parallel to coupling capacitor "$C_{c\_func}$" and connecting to coupling capacitor "$C_{c\_func}$" with switches 1100 and 1200 controlled by bits "ctrl_$n_i$" and "ctrl_$p_i$" (where i=0, 1 . . . Kcpc-1), respectively. The polarity ("either "0" or "1") of "ctrl_$n_i$" and "ctrl_$p_i$" is determined by the coupling capacitor error coefficient bit "cb_cpc$_{m(i)}$" assigned to "ctrl_$n_i$" and "ctrl_$p_i$" and the final mismatch polarity bit "$DP_{Cc}$" stored in DFF array 451. During normal analog to digital conversion, the relationship between the polarity "ctrl_$n_i$" or "ctrl_$p_i$" and the "cb_cpc$_{m(i)}$" and "$DP_{Cc}$" is as follows. Initially, all "ctrl_$n_i$" are set to "1" turning on all switches 1100 to connect trimming capacitors "$C_{c\_trim}$" controlled by "ctrl_$n_i$" in parallel to "$C_{c\_func}$" and all "ctrl_$p_i$" are set to "0" turning off all switches 1200 to disconnect trimming capacitors "$C_{c\_trim}$" controlled by "ctrl_$p_i$" from coupling capacitor "$C_{c\_func}$". During normal analog to digital conversion, when "$DP_{Cc}$" is low and the corresponding coupling capacitor error coefficient bit "cb_cpc$_{m(i)}$" assigned to "ctrl_$p_i$" is set to "1", "ctrl_$p_i$" is set to "1" turning on switch 1200 and connecting trimming capacitors "$C_{c\_trim}$" controlled by "ctrl_$p_i$". When "$DP_{Cc}$" is high and the corresponding coupling capacitor error coefficient bit "cb_cpc$_{m(i)}$" assigned to "ctrl_$n_i$" is set to "1", "ctrl_$n_i$" is set to "0" turning off switch 1100 and disconnecting trimming capacitors "$C_{c\_trim}$" controlled by "ctrl_$n_i$". When the coupling capacitor error coefficient bit "cb_cpc$_{m(i)}$" assigned to "ctrl_$p_i$" and "ctrl_$n_i$" is set to "0", the trimming capacitors "$C_{c\_trim}$" controlled by "ctrl_$p_i$" and "ctrl_$n_i$" maintain their initial state (either connected or disconnected).

The mismatch error correction voltages of the MSBs change with the MSBs value variation during the binary search process which is different from the offset and the coupling capacitor mismatch compensation scheme. There the compensation voltages are generated when function capacitor array 420 switches from the sampling mode to the comparison mode and stays constant through the entire conversion. As shown in FIG. 4, the MSBs "b<n-1:n-L>" under calibration are generated from SAR 441 in control logic 440 and are sent to calibration logic 450 to create the digital control signals 455. Control signals 455 are provided to MSBs calibration arrays 538 to control the switches connected between the positive/negative references and bottom plates 545 of capacitors 645 in calibration arrays 538. Since the MSB capacitor cell mismatch error correction procedure in normal conversion mode are same for the different MSB calibration arrays, the bit "b<i>" calibration array 538 is used as an example to explain MSB calibration arrays 538 operation in detail. Similar to offset calibration array 536 shown in FIG. 6a, "b<i>" calibration array 538 is divided into sub-main calibration array 641 and sub-auxiliary calibration array 642 shown in FIG. 6c. Bottom plates 545 of capacitors 645 in calibration array 538 are connected to switches 683, 684 and 685. Switches 684 and 685 are controlled by the control signals "cb_msb$_i$<K$_{msb(i)}$-1:0>" which are determined by the "b<i>" error correction bits stored in DFF array 451. For the different mismatch polarity "$DP_{msb(i)}$" values of the capacitor cell "$C_i$" corresponding to the bit "b<i>" in function capacitor array 420, different operations are involved in "b<i>" sub-main calibration array 641 and "b<i>" sub-auxiliary calibration array 642. When "$DP_{msb(i)}$" is "0" (defined as $C_i$>$Ci_i$, where "$Ci_i$" is the expected value of "$C_i$" (the expected value is the capacitor value for b<i> without mismatch), the error correction voltage is generated from "b<i>" sub-main calibration array 641 and no operation occurs in "b<i>" sub-auxiliary calibration array 642. When "$DP_{MSB(i)}$" is "1" (defined as $C_i$<$Ci_i$), the error correction voltage is generated from either "b<i>" sub-main calibration array 641 or "b<i>" sub-auxiliary calibration array 642 depending on the status of the "b<i>". When the "b<i>" is set to "1", the error correction voltage is generated from "b<i>" sub-main calibration array 641; when the "b<i>" is set to "0", the error correction voltage is generated from "b<i>" sub-auxiliary calibration array 642. Capacitor cells 645 in both sub-main and sub-auxiliary calibration arrays 641 and 642, respectively, are only involved in the error correction voltage generation operation when the error correction bits that determine the polarity of the control signals "cb_msb$_i$<K$_{msb(i)}$-1:0>" of switches 684 and 685 are set to "1"s.

The detailed operation is as follows.

$$\Delta C_i = C_i - Ci_i > 0 \qquad \text{Case I:}$$

In the sampling mode, bottom plates 545 of capacitors 645 in "b<i>" sub-main calibration array 641 are connected to the analog input "$V_{IN}$", when the error correction bits corresponding to capacitors 645 are set to "1"s, and to the negative reference "$V_N$", when the error correction bits corresponding to capacitors 645 are set to "0"s. In the comparison mode, bottom plates 545 of capacitors 645 in "b<i>" sub-main calibration array 641 with corresponding error correction bits set to "1"s switch to either the positive reference, when the "b<i>" is "1", or to the negative reference, when the "b<i>" is "0". The bottom plates 545 of capacitors 645 in the "b<i>" sub-main calibration array with corresponding error correction bits set to "0"s keep the negative reference connection. Bottom plates 545 of capacitors 646 in "b<i>" sub-auxiliary calibration array 642 stay with the negative reference connection throughout the entire conversion process. Therefore, if the final "b<i>" is "1", the voltage variation at bottom plates 545 of capacitors 645 involved in the bottom connections switch in the "b<i>" sub-main calibration array 641 is "$V_P$-$V_{IN}$"; if the final "b<i>" is "0", the voltage variation at bottom plates 545 of capacitors 645 involved in the bottom connections switch in "b<i>" sub-main calibration array 641 is "$V_N$-$V_{IN}$". The voltage variation at bottom plates 545 of all capacitors 645 in "b<i>" sub-auxiliary calibration array 642 is zero. This is consistent with function capacitor array 420 operation in the conversion mode, where, when the "b<i>" is "1", the voltage variation at bottom plates 524 of capacitor cell "$C_i$" is "$V_P$-$V_{IN}$"; when the "b<i>" is "0", the voltage variation at bottom plates 524 of capacitor cell "$C_i$" is "$V_N$-$V_{IN}$". The voltage variation at bottom plates 545 of capacitors 645 in "b<i>" calibration array 538 is coupled to positive comparator input 412 synchronized with the "b<i>" toggling and scaled down first by the total capacitance in the fine calibration array 430, and then by the total capacitance shown at comparator input 412. The voltage variation due to capacitor cell "$C_i$" switching in function capacitor array 420 is coupled to negative comparator input 411 synchronized with the "b<i>" toggling and scaled down by the total capacitance shown at comparator input 411 (node "$A_C$"). Since the "b<i>" error correction voltage present at comparator input 412 (node "$B_C$") has the same polarity and is equal to the "$\Delta V_i$" shown at comparator input 411 due to the "$\Delta C_i$", the "b<i>" error correction voltage cancels the capacitor cell "$C_i$" mismatch effect at differential inputs 411 and 412 of comparator 410 and makes output 414 of comparator 410 error free.

$$\Delta C_i = C_i - Ci_i < 0 \qquad \text{Case II:}$$

In the sampling mode, bottom plates 545 of capacitors 645 in "b<i>" sub-main calibration array 641 are connected to the positive reference "$V_P$", when the "b<i>" error correction bits corresponding to capacitors 645 are set to "1"s, and to the negative reference "$V_N$" when the "b<i>" error correction bits corresponding to capacitors 645 are set to "0"s. In the comparison mode, bottom plates 545 of capacitors 645 in "b<i>" sub-main calibration array 641 with corresponding error correction bits set to "1"s are switched between the analog input "$V_{IN}$" and the positive reference "$V_P$", when the "b<i>" switches between "1" and "0", respectively. Bottom plates 545 of capacitors 645 in "b<i>" sub-main calibration array 641 with corresponding error correction bits set to "0"s hold the negative reference connection. On the other hand, in the sampling mode, bottom plates 545 of capacitors 645 in "b<i>" sub-auxiliary calibration array 642 are initially connected to the negative reference "$V_N$" for both "1" and "0" settings of the "b<i>" error correction bits. In the comparison mode, bottom plates 545 of capacitors 645 in "b<i>" sub-auxiliary calibration array 642 with corresponding error correction bits set to "1"s are switched between the analog input "$V_{IN}$" and the negative reference "$V_N$", when the "b<i>" switches between "0" and "1", respectively. Bottom plates 545 of capacitors 645 in "b<i>" sub-auxiliary calibration array 642 with corresponding error correction bits set to "0"s hold the negative reference connection. Therefore, if the final "b<i>" is "1", the voltage variation at bottom plates 545 of capacitors 645 involved in the bottom connections switch in "b<i>" sub-main calibration array 641 is "$V_{IN}-V_P$" and the voltage variation at bottom plates 545 of capacitors 645 involved in the bottom connections switch in "b<i>" sub-auxiliary calibration array 642 is zero. If the final "b<i>" is "0", the voltage variation at bottom plates 545 of capacitors 645 involved in the bottom connections switch in "b<i>" sub-main calibration array 641 is zero and the voltage variation at bottom plates 545 of capacitors 645 involved in the bottom connections switch in "b<i>" sub-auxiliary calibration array 642 is "$V_{IN}-V_N$". Compared with function capacitor array 420, where, when the "b<i>" is "1", the voltage variation at bottom plates 524 of capacitor cell "$C_i$" is "$V_P-V_{IN}$"; when the "b<i>" is "0", the voltage variation at bottom plates 524 of capacitor cell "$C_i$" is "$V_N-V_{IN}$", the voltage variation from both function capacitor array 420 and calibration array 430 have the same value with opposite polarity. The voltage variation in "b<i>" calibration array 538 is coupled to positive comparator input 411 synchronized with the "b<i>" toggling and scaled down first by the total capacitance in the fine calibration array 430, and then by the total capacitance shown at comparator input 412 (node "$B_C$"). The voltage variation due to the capacitor cell "$C_i$" switching in function capacitor array 420 is coupled to the negative comparator input 411 synchronized with the "b<i>" toggling and scaled down by the total capacitance shown at comparator input 411 (node "$A_C$"). The introduction of the error correction voltage given at comparator input 412 with opposite polarity of the mismatch voltage present at comparator input 411 increases the differential input voltage of comparator 410 and compensates the differential voltage loss due to the "$C_i<Ci$".

The invention claimed is:

1. A self-calibrating analog-to-digital converter comprising:
   a comparator having:
      a first input, connected to a first capacitor array, configured to receive an input signal, a first positive reference, and a first negative reference, under control of a first sampling clock and a first plurality of digital bits from a successive approximation register, and perform a binary search;
      a second input, connected to a second capacitor array, configured to receive a calibration signal, a second positive reference, and a second negative reference, under control of a second sampling clock and a second plurality of digital bits from a Data Flip Flop (DFF) array, and provide error compensation signals; and
      an output electrically coupled to digital logic and calibration logic.

2. The self-calibrating analog-to-digital converter of claim 1, wherein the calibration logic controls an offset and a capacitor mismatch searching process.

3. The self-calibrating analog-to-digital converter of claim 1, wherein the DFF array is configured to store capacitor mismatch coefficients.

4. The self-calibrating analog-to-digital converter of claim 1, wherein the first capacitor array comprises a first plurality of binary-weighted capacitors and is divided into a first coarse capacitor array and a first fine capacitor array with a first coupling capacitor electrically coupling the first fine capacitor array to the first coarse capacitor array.

5. The self-calibrating analog-to-digital converter of claim 4, wherein top plates of the plurality of capacitors in the first coarse capacitor array are electrically coupled to a first terminal of the first coupling capacitor and the first input of the comparator.

6. The self-calibrating analog-to-digital converter of claim 4, wherein top plates of the plurality of capacitors in the first fine array are electrically coupled to a second terminal of the first coupling capacitor.

7. The self-calibrating analog-to-digital converter of claim 1, wherein the second capacitor array is divided into a second coarse capacitor array and a second fine capacitor array with a second coupling capacitor electrically coupling the second fine capacitor array to the second coarse capacitor array.

8. The self-calibrating analog-to-digital converter of claim 7, wherein the second fine capacitor array is divided into a plurality of sub-capacitor arrays.

9. The self-calibrating analog-to-digital converter of claim 8, wherein the plurality of sub-capacitor arrays comprises an offset calibration array, a coupling capacitor mismatch calibration array, and a multi most significant bits capacitor mismatch calibration array.

10. The self-calibrating analog-to-digital converter of claim 9, wherein each of the plurality of sub-capacitor arrays is divided into a main capacitor array and an auxiliary capacitor array, each array comprising a plurality of binary weighted capacitors.

11. A method of calibrating an offset error in an analog to digital converter comprising:
   initializing a first comparator input and a second comparator input to a common mode voltage;
   applying, via a first set of switches, a first signal about equal to a negative reference voltage to bottom plates of all capacitors in a first capacitor array;
   applying, via a second set of switches, a second signal about equal to the negative reference voltage to the bottom plates of the capacitors in the first capacitor array;
   producing an error signal at the first comparator input;
   digitizing the error signal by using a step searching voltage generated by an offset calibration array;
   storing a digital representation of the error signal in an array; and applying the digital representation of the error signal to the offset calibration array to generate an offset correction voltage at the second comparator input.

12. A method of calibrating a system offset error, a coupling capacitor mismatch error, and most significant bits (MSBs) capacitor mismatch error in an analog to digital converter, the method comprising:

detecting and digitizing the system offset error by using an offset calibration array under the control of a calibration logic, and storing first set of error correction bits in an array;

detecting and digitizing the coupling capacitor mismatch error in a first capacitor array by using a coupling capacitor mismatch calibration array under the control of a calibration logic, and storing second set of error correction bits in the array;

detecting and digitizing the MSB capacitor mismatch error in the first capacitor array from the lower bit up to the higher bit one by one by using the corresponding MSB capacitor mismatch calibration array under the control of the calibration logic, and storing a third set of error correction bits in the array;

trimming a coupling capacitor in the first capacitor array with the second set of error correction bits in a conversion mode;

applying an offset compensation voltage at the beginning of the conversion mode; and applying the third set of error correction bits synchronized with the corresponding MSBs variation.

* * * * *